(12) United States Patent
Choi et al.

(10) Patent No.: US 7,667,493 B2
(45) Date of Patent: Feb. 23, 2010

(54) DATA TRANSMITTER

(75) Inventors: Hae-Rang Choi, Gyeonggi-do (KR);
Kun-Woo Park, Gyeonggi-do (KR);
Yong-Ju Kim, Gyeonggi-do (KR);
Hee-Woong Song, Gyeonggi-do (KR);
Ic-Su Oh, Gyeonggi-do (KR);
Hyung-Soo Kim, Gyeonggi-do (KR);
Tae-Jin Hwang, Gyeonggi-do (KR);
Ji-Wang Lee, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 50 days.

(21) Appl. No.: 12/164,948

(22) Filed: Jun. 30, 2008

(65) Prior Publication Data
US 2009/0147883 A1    Jun. 11, 2009

(30) Foreign Application Priority Data
Dec. 11, 2007    (KR) ...................... 10-2007-0128236

(51) Int. Cl.
*H03K 19/0175* (2006.01)

(52) U.S. Cl. ............................. 326/87; 326/33; 327/544
(58) Field of Classification Search ............ 326/82–83, 326/86–87, 30, 33; 327/18, 109, 544
See application file for complete search history.

(56) References Cited

U.S. PATENT DOCUMENTS

| | | | |
|---|---|---|---|
| 6,292,015 B1 * | 9/2001 | Ooishi et al. | 326/33 |
| 7,456,650 B2 * | 11/2008 | Lee | 326/30 |
| 7,495,474 B2 * | 2/2009 | Komatsu et al. | 326/82 |

* cited by examiner

*Primary Examiner*—James Cho
(74) *Attorney, Agent, or Firm*—IP & T Law Firm PLC

(57) ABSTRACT

Data transmitter includes a first and second output nodes terminated to a first level, a controller configured to generate an off signal that is activated by logically combining first and second data during a low-power mode, a first driver configured to drive the first or second output node to a second level in response to the first data and a second driver configured to drive the first or second output node to the second level with a driving force different from that of the first driver in response to the second data, the second driver being turned off when the off signal is activated.

9 Claims, 7 Drawing Sheets

OUTPUT A WHEN CON IS '0' & OUTPUT B WHEN CON IS '1'

DATA TRANSMITTER

CROSS-REFERENCE TO RELATED APPLICATIONS

The present invention claims priority of Korean patent application number 10-2007-0128236, filed on Dec. 11, 2007, which is incorporated by reference in its entirety.

BACKGROUND OF THE INVENTION

The present invention relates to a data transmitter in a semiconductor device used to transmit data to the outside of a chip, especially, a data transmitter employing a pulse amplitude modulation (PAM) method, and more particularly, to a data transmitter capable of outputting data in a normal mode and a low-power mode.

FIG. 1 illustrates voltage levels at output nodes depending on logic levels of data output through a conventional data transmitter employing a four level PAM (four level Pulse Amplitude Modulation, henceforth 4PAM). In this and other waveform diagrams, D0D1 represents the logic levels of bits D0 and D1 sequentially, e.g. 10 means that D0 is high and D1 is low.

The conventional data transmitter of FIG. 1 outputs two bits of data, D1 and D0 through two output nodes TX_OUT and TX_OUTB in a differential manner. Therefore, the data D0 and D1 output through the two output nodes TX_OUT and TX_OUTB have four logic levels of 'Fully High', 'High', 'Low' and 'Fully Low', not two logic levels of 'High' and 'Low'.

As illustrated in FIG. 1, when (D0, D1) is (0, 0), the output nodes TX_OUT and TX_OUTB are at 'Fully Low' and 'Fully High' levels, respectively. When (D0, D1) is (1, 0), the output nodes TX_OUT and TX_OUTB go to 'Low' and 'High' levels, respectively; when (D0, D1) is (0, 1), the output nodes TX_OUT and TX_OUTB go to 'High' and 'Low' levels, respectively; and when (D0, D1) is (1, 1), the output nodes TX_OUT and TX_OUTB go to 'Fully High' and 'Fully Low' levels, respectively.

FIG. 2 is a circuit diagram illustrating a conventional data transmitter outputting data having waveforms shown in FIG. 1.

The conventional data transmitter outputting data by the 4PAM includes a first driver 210 and a second driver 220. The first and second drivers 210 and 220 pull down the first and second output nodes TX_OUT and TX_OUTB, which are terminated with pull-up resistors.

The first driver 210 pulls down the first output node TX_OUT or the second output node TX_OUTB in response to the data D0. Specifically, when the data D0 changes to 'High' level (i.e., the data D0B changes to 'Low' level), the first driver 210 pulls down the second output node TX_OUTB. On the contrary, when the data D0 changes to 'Low' level (i.e., the data D0B changes to 'High' level), the first driver 210 pulls down the first output node TX_OUT.

In detail, when the data D0 changes to 'High' level, a transistor M21 is turned on but a transistor M22 is turned off. Accordingly, the driving control signal NET1 goes to 'Low' level and the driving control signal NET2 goes to 'High' level, thus turning off a transistor M24 and turning on a transistor M25. Therefore, the first driver 210 pulls down only the second output node TX_OUTB. On the contrary, when the data D0 changes to 'Low' level, the transistor M24 is turned on so that the first driver 210 pulls down the first output node TX_OUT. Transistor M23, biased by voltage VBIAS1, provides a current sink for transistors M21 and M22, and transistor M26, biased by voltage VBIAS2, provides a current sink for transistors M24 and M25.

The second driver 220 pulls down the first output node TX_OUT or the second output node TX_OUTB in response to the data D1. When the data D1 changes to 'High' level (i.e., the data D1B changes to 'Low' level), the second driver 220 pulls down the second output node TX_OUTB. On the contrary, when the data D1 changes to 'Low' level (i.e., the data D1B changes to 'High' level), the second driver 220 pulls down the first output node TX_OUT. A detailed operating principle of the second driver 220 is the same as the first driver 210, and thus further description will be omitted herein. Transistor M29 provides a current sink for transistors M27 and M28, and transistor M32 provides a current sink for transistors M30 and M31.

The second driver 220 is designed to have twice the driving force of the first driver 210. That is, transistor M32 sinks twice the current of transistor M26.

Since the first and second drivers 210 and 220 have different driving forces, the output nodes TX_OUT and TX_OUTB may have logic levels shown in FIG. 1.

Hereinafter, description will be concentrated on the first output node TX_OUT for convenience in description. The first output node TX_OUT is at 'Fully High' level when both the first and second drivers 210 and 220 do not pull down the first output node TX_OUT. When only the first driver 210 pulls down the first output node TX_OUT, the first output node TX_OUT has 'High' level. When only the second driver 220 pulls down the first output node TX_OUT, the first output node TX_OUT has 'Low' level because the second driver 220 has twice the driving force of the first driver 210. When both the first and second drivers 210 and 220 pull down the first output node TX_OUT, the first output node TX_OUT changes to 'Fully Low' level.

Basically, the first and second drivers 210 and 220 make current sink from the first and second output nodes TX_OUT and TX_OUTB, that is, pull down the first and second output nodes TX_OUT and TX_OUTB, thereby changing logic levels of the first and second output nodes TX_OUT and TX_OUTB. Such a method, however, causes the first and second output nodes TX_OUT and TX_OUTB to always consume current except for the case of 'Fully High' level. Accordingly, the data transmitter consumes a large amount of current unnecessarily.

In FIG. 2, the symbol PWDN denotes a power down signal, which maintain its 'Low' level when a circuit operates normally.

FIG. 3 illustrates voltage levels at output nodes TX_OUT and TX_OUTB of another conventional data transmitter for low power consumption.

The output nodes TX_OUT and TX_OUTB of the conventional data transmitter have logic levels shown in FIG. 3, which differs from FIG. 1. Referring to FIG. 3, at least one of the output nodes TX_OUT and TX_OUTB always maintains 'Fully High' level. The meaning the logic level of at least one of the output nodes TX_OUT and TX_OUTB is 'Fully High' is that there is no current sink to a ground voltage (VSS) terminal from the output nodes TX_OUT and TX_OUTB. Therefore, when the output nodes TX_OUT and TX_OUTB maintain the logic levels shown in FIG. 3, current consumption is reduced in comparison with the conventional data transmitter outputting data with the waveforms shown in FIG. 1.

As described above, there have been employed the conventional data transmitter outputting data with the waveform of FIG. 1 and another conventional data transmitter outputting data with the waveform of FIG. 3. Hence, a variety of data transmitters are required to meet various data transmission standards.

SUMMARY OF THE INVENTION

Embodiments of the present invention are directed to providing a data transmitter, which is applicable to a variety of outputting methods.

In accordance with an aspect of the invention, there is provided first and second output nodes terminated to a first level, a controller configured to generate an off signal that is activated by logically combining first and second data during a low-power mode, a first driver configured to drive the first or second output node to a second level in response to the first data and a second driver configured to drive the first or second output node to the second level with a driving force different from that of the first driver in response to the second data, the second driver being turned off when the off signal is activated.

In accordance with an aspect of the invention, there is provided a data transmitter that includes a first and second output nodes terminated to a first level, a decoder configured to unchangingly output a first data pair of a first data and an inverted first data and a second data pair of a second data and an inverted second data, except when the first and second data differ from each other during a low-power mode, and further configured to output the first data and inverted first data inversely and configured to output a deactivated second data pair, when the first and second data differ from each other during a low-power mode, a first driver configured to drive the first and second output nodes to a second level respectively in response to the first data and inverted first data of the first data pair output from the decoder and a second driver configured to drive the first and second output nodes to the second level respectively in response to the second data and inverted second data of the second data pair output from the decoder, the first and second drivers having different driving forces. In accordance with another aspect of the invention, there is provided a data transmitter that includes first and second output nodes terminated to a first level, a decoder configured to unchangingly output a first data pair of a first data and an inverted first data and a second data pair of a second data and an inverted second data, except when the first and second data differ from each other during a low-power mode, and further configured to output the first data and inverted first data inversely and configured to output a deactivated second data pair, when the first and second data differ from each other during a low-power mode, a first driver configured to drive the first and second output nodes to a second level respectively in response to the first data and inverted first data of the first data pair output from the decoder and a second driver configured to drive the first and second output nodes to the second level respectively in response to the second data and inverted second data of the second data pair output from the decoder, the first and second drivers having different driving forces.

DESCRIPTION OF SPECIFIC EMBODIMENTS

Hereinafter, a data transmitter in accordance with the present invention will be described in detail with reference to the accompanying drawings.

Figure 4:
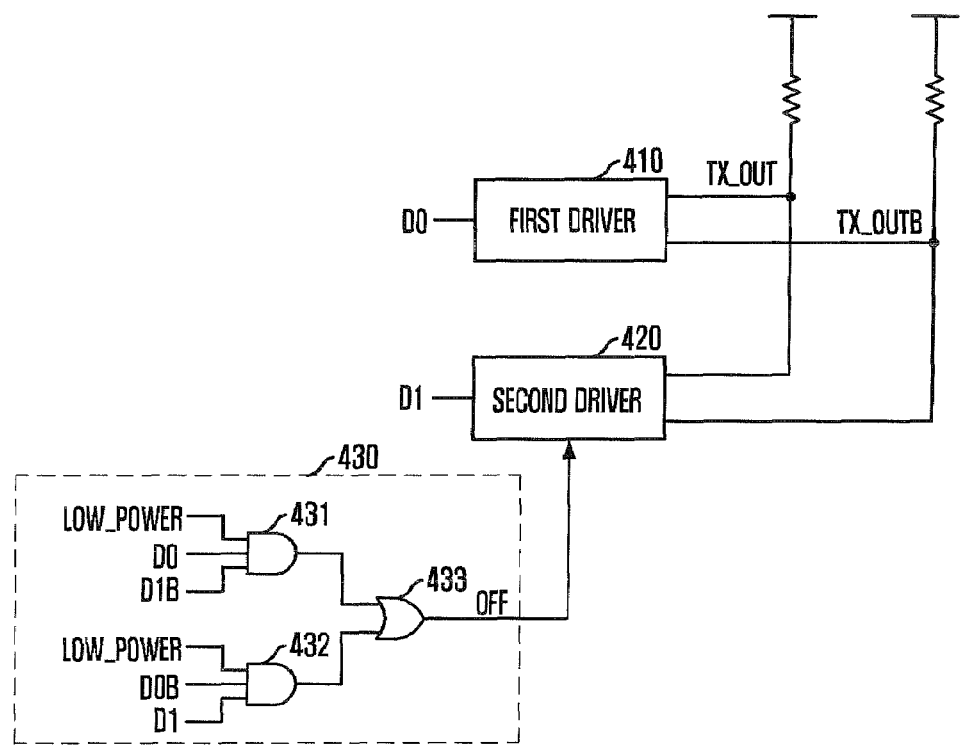
FIG. 4 is a block diagram of a data transmitter in accordance with an embodiment of the present invention.

FIG. 4 is a block diagram of a data transmitter in accordance with an embodiment of the invention.

The data transmitter in accordance with this embodiment of the invention includes first and second output nodes TX_OUT and TX_OUTB terminated to a first level, a controller 430, a first driver 410, and a second driver 420. The controller 430 generates an off signal OFF activated by logically combining the first and second data D0 and D1 during a low-power mode, that is, when a LOW_POWER signal is activated. The first driver 410 drives the first output node TX_OUT or the second output node TX_OUTB to a second level in response to the first data D0. The second driver 420 drives the first output node TX_OUT or the second output node TX_OUTB to the second level with a driving force different from that of the first driver 410 in response to the second data D1. Here, the second driver 420 is turned off when the off signal OFF is activated.

The first and second output nodes TX_OUT and TX_OUTB, which are output nodes of the data transmitter, are terminated to the first level. The first and second levels are relatively defined. When the first level is a pull-up voltage level, the second level is a pull-down voltage level. When the second level is a pull-up voltage level, the first level is a pull-down voltage level. That is, when the first and second output nodes TX_OUT and TX_OUTB are terminated with pull-up resistors, the first and second drivers 410 and 320 pull down the first and second output nodes TX_OUT and TX_OUTB. When the first and second output nodes TX_OUT and TX_OUTB are terminated with pull-down resistors, the first and second drivers 410 and 420 pull up the first and second output nodes TX_OUT and TX_OUTB.

For convenience in description, following description will be made assuming that the first and second output nodes TX_OUT and TX_OUTB are terminated with pull-up resistors, and thus the first and second drivers 410 and 420 pull down the first and second output nodes TX_OUT and TX_OUTB.

The controller 430 controls the off signal OFF to be always deactivated during the normal mode when the LOW_POWER signal is deactivated, and controls the off signal OFF to be activated by logically combining the first and second data D0 and D1 during the low-power mode when the LOW_POWER signal is activated. In detail, the off signal OFF may be set such that it is activated when the LOW_POWER signal is activated to 'High' level and the first and second data D0 and D1 differ from each other. Referring to FIG. 4, the off signal OFF, i.e., an output of an OR gate 433, is activated only when (D0, D1) is (1, 0) or (0, 1) in a state that the LOW_POWER signal is activated.

The first driver 410 drives the first output node TX_OUT or the second output node TX_OUTB in response to the first data D0. Specifically, when the first data D0 has 'High' level, i.e., 1, the first driver 410 pulls down the second output node TX_OUTB. On the contrary, the first drive 410 pulls down the first output node TX_OUT when the first data D0 has 'Low' level, i.e., 0. The first driver 410 may be configured to receive or not to receive the off signal OFF.

Figure 1:
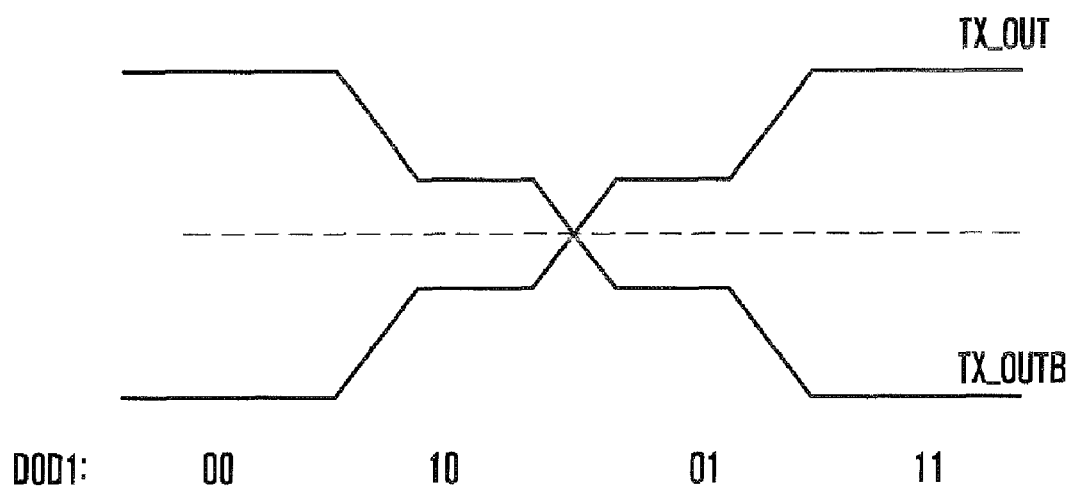
FIG. 1 illustrates voltage levels at output nodes depending on logic levels of data output through a conventional data transmitter employing a four level pulse amplitude modulation (4PAM).
Figure 2:
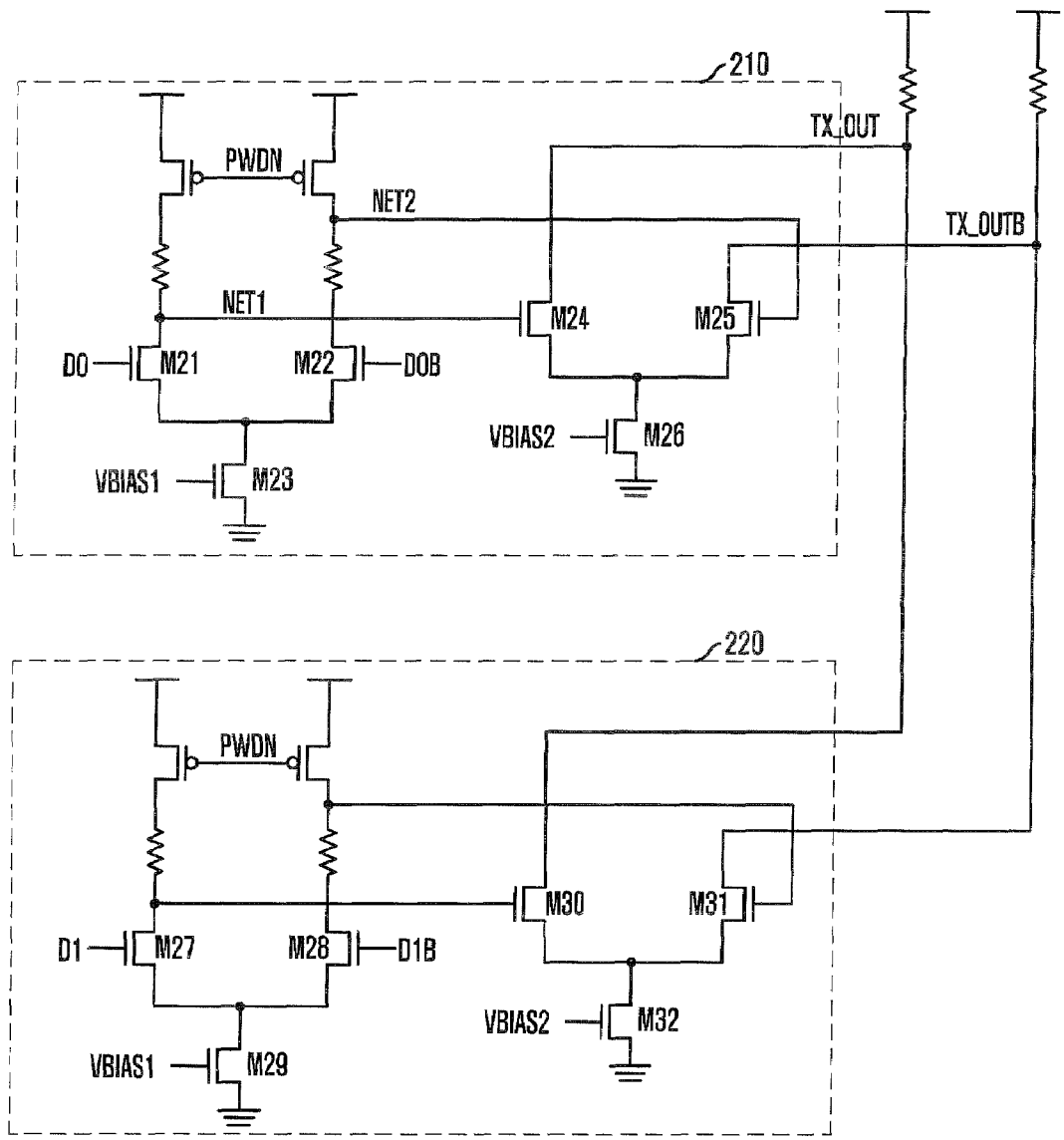
FIG. 2 is a circuit diagram illustrating a conventional data transmitter outputting data having waveforms shown in FIG. 1.

When the first driver 410 is designed not to receive the off signal OFF, the first driver 410 may have the same configuration as the conventional first driver (see 210 of FIG. 2). In this case, regardless of the normal or low-power mode, the first driver 410 pulls down the second output node TX_OUTB if the first data has a logic value of 1, and pulls down the first output node TX_OUT if the first data has a logic value of 0. As such, when the first driver 410 is designed not to receive the off signal OFF, the data transmitter outputs the data D0 and D1 having waveforms shown in FIG. 7A during the normal mode, and outputs the data D0 and D1 having waveforms shown in FIG. 7B during the low-power mode.

However, when the first driver 410 is configured to receive the off signal OFF, the first driver 410 has a configuration shown in FIG. 5, which will be more fully described later. In this case, when the off signal OFF is deactivated, that is, when the first data is equal to the second data during normal and low-power modes, the first driver 410 pulls down the second output node TX_OUTB if the first data D0 is 1, and pulls down the first output node TX_OUT if the first data is 0. When, however, the off signal OFF is activated, that is, when the first data differs from the second data during the low-power mode, the first driver drives the first and second output nodes TX_OUT and TX_OUTB inversely. That is, when the off signal OFF is activated, the first driver 410 pulls down the first output node TX_OUT if the data is 1, and pulls down the second output node TX_OUTB if the data is 0. Consequently, the data transmitter outputs the data D0 and D1 having waveforms shown in FIG. 7A during the normal mode, but outputs the data D0 and D1 having waveforms as shown in FIG. 7C during the low-power mode, when the first driver 410 is designed to receive the off signal OFF.

The second driver 420 is responsive to the second data D1 to pull down the first output node TX_OUT or the second output node TX_OUTB with a different driving force from that of the first driver 410. This is because it is possible to represent four levels, i.e., 'Fully High', 'High', 'Low' and 'Fully Low', not two levels of 'High' and 'Low' only if the first driver 410 differs in driving force from the second driver 420. In order to represent four levels, the second driver 420 may have only to differ in driving force from the first driver 410. In following waveform diagrams of FIG. 7, however, it is exemplarily illustrated that the second driver 420 has twice the driving force of the first driver 410.

The second driver 420 pulls down the second output node TX_OUTB if the second data D1 is 1 ('High'), and pulls down the second output node TX_OUTB if the second data D1 is 0 ('Low'). However, when the off signal OFF is activated, that is, when the first data and the second data differ from each other during the low-power mode, the second driver 420 is turned off. Here, the meaning the second driver 420 is turned off is that the second driver 420 does not pull down any one of the first and second output nodes TX_OUT and TX_OUTB.

Figure 5:
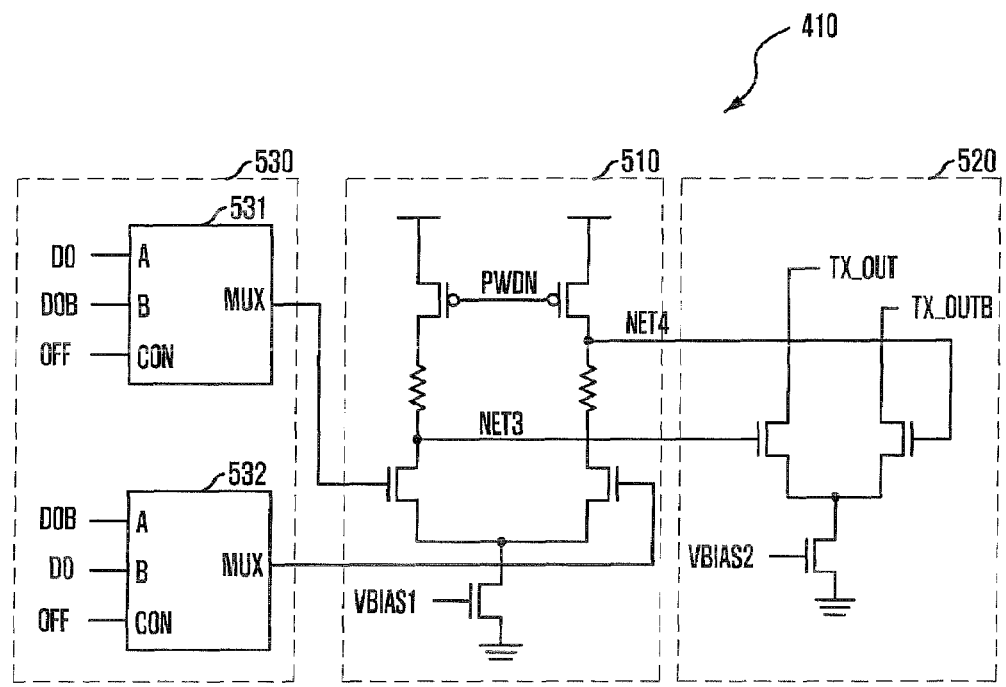
FIG. 5 is a circuit diagram illustrating a first driver (410) in FIG. 4, which is designed to receive an off signal (OFF).

FIG. 5 is a circuit diagram illustrating the first driver 410 in FIG. 4, which is designed to receive the off signal OFF.

The first driver 410, which is basically similar in configuration to the conventional first driver (see 210 of FIG. 2), includes a pre-driving unit 510 configured to generate driving control signals NET3 and NET4 in response to a first data pair of a first data D0 and an inverted first data D0B, and a main driving unit 520 configured to pull down the first output node TX_OUT or the second output node TX_OUTB in response to the driving control signals NET3 and NET4.

However, the first driver 410 further includes an input unit 530 configured to input the first data pair D0 and D0B identically or oppositely to the conventional first driver (see 210 of FIG. 2) depending on a logic level of the off signal OFF.

The input unit 530 receives the first data pair D0 and D0B identically or oppositely to the conventional first driver (210) using multiplexing units 531 and 532. When the off signal OFF is deactivated, the multiplexing unit 531 outputs the data D0 and the multiplexing unit 532 outputs the data D0B, in like manner as the conventional first driver (210). In contrast, when the off signal OFF is activated, the multiplexing unit 531 outputs the data D0B, and the multiplexing unit 532 outputs the data D0.

Therefore, when the off signal OFF is deactivated, i.e., when the first and second data are equal during the normal and low-power modes, the first driver 410 pulls down the second output node TX_OUTB if the first data is 1, and pulls down the first output node TX_OUT if the first data D0 is 0. When, however, the off signal OFF is activated, i.e., when the first data differs from the second data during the low-power mode, the first driver 410 drives the first and second output nodes TX_OUT and TX_OUTB inversely. That is, the first driver 410 pulls down the first output node TX_OUT if the data is 1, and pulls down the second output node TX_OUTB if the data is 0.

Figure 6:
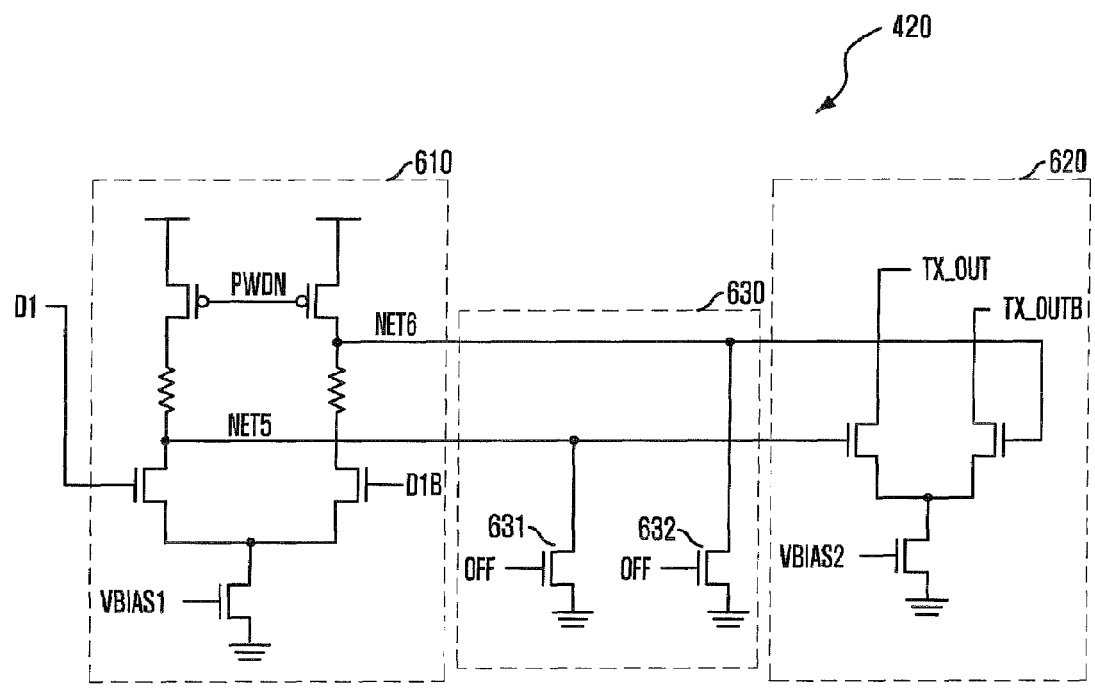
FIG. 6 is a circuit diagram of a second driver (420) in FIG. 4.

FIG. 6 is a circuit diagram of the second driver 420 in FIG. 4.

The second driver 420 includes a pre-driving unit 610 configured to generate driving control signals NET5 and NET6 in response to a second data pair of a second D1 and an inverted second data D1B, an off control unit 630 configured to deactivate the driving control signals NET5 and NET6 when the off control signal OFF is activated, and a main driving unit 620 configured to drive the first output node TX_OUT or the second output node TX_OUTB in response to the driving control signals NET5 and NET6.

The second driver 420 has the same configuration as the conventional second driver (see 210 of FIG. 2), that is, is configured with the pre-driving unit 610 and the main driving unit 620. Accordingly, the second driver 420 pulls down the second output node TX_OUTB if the second data D1 is 1 ('High'), and pulls down the first output node TX_OUT if the second data D1 is 0.

However, the second driver 420 further includes the off control unit 630, which is not provided in the conventional second driver (see 210 of FIG. 2). Hence, the driving control signals NET5 and NET6 are deactivated when the off signal OFF is activated. Since the first output node TX_OUT or the second output node TX_OUTB is pulled down when the driving control signals NET5 and NET6 are activated to 'High' level, the deactivation of the driving control signals NET5 and NET6 means that the driving control signals NET5 and NET6 change to 'Low' level. Specifically, when the off signal OFF is activated, transistors 631 and 632 are turned on, and the driving control signals NET5 and NET6 change to 'Low' level. Consequently, the second driver 420 does not pull down any one of the first and second output nodes TX_OUT and TX_OUTB.

In conclusion, the second driver 420 operates in the same manner as the conventional second driver (220 of FIG. 2) when the off signal OFF is deactivated; however, when the off signal OFF is activated, the second driver 420 is turned off so that any one of the first and second output nodes TX_OUT and TX_OUTB is not pulled down.

Figure 7A:
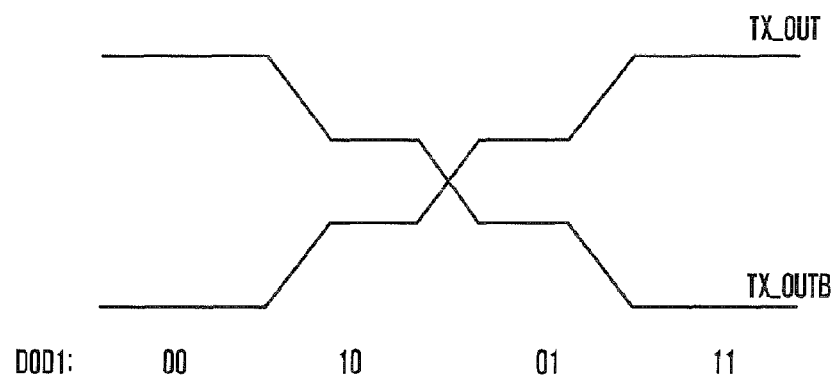
FIG. 7A to 7C are waveform diagrams illustrating levels of data output through the data transmitter of FIG. 4.
Figure 7B:
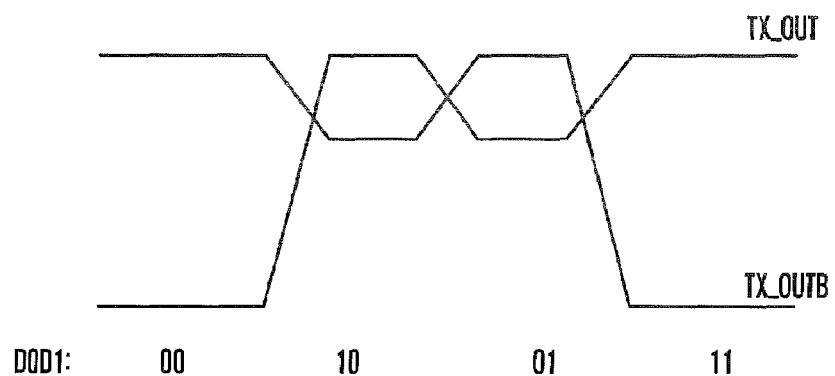
Figure 7C:
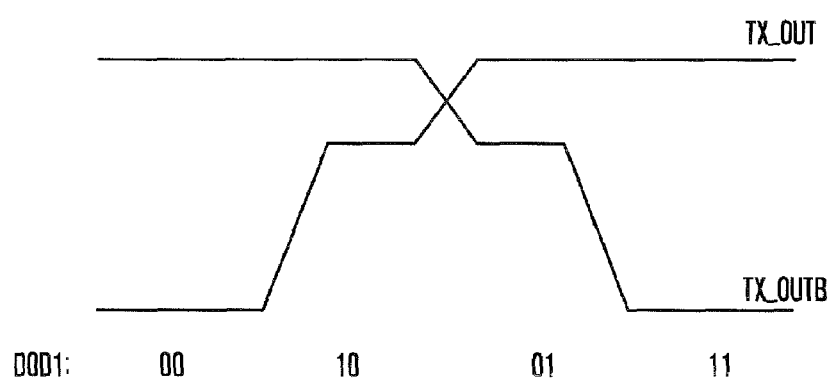

FIG. 7A to 7C are waveform diagrams illustrating levels of data output through the data transmitter of FIG. 4.

Figure 3:
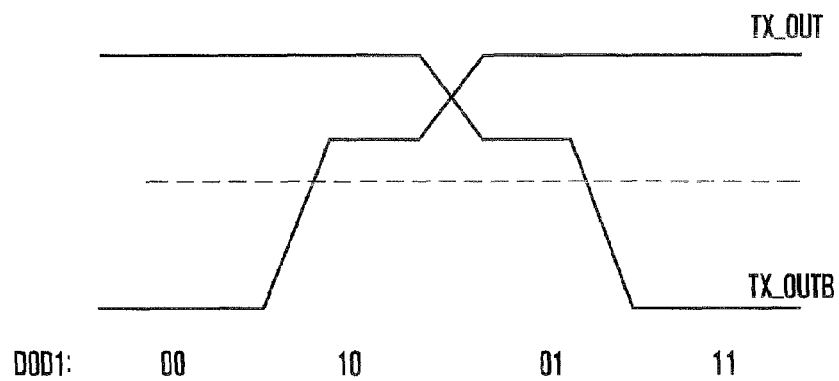
FIG. 3 illustrates voltage levels at output nodes (TX_OUT and TX_OUTB) of another conventional data transmitter for low power consumption.

FIG. 7A illustrates waveforms of data D0 and D1 output through the data transmitter during the normal mode, i.e., when the LOW_POWER signal is deactivated. Since the first and second drivers 410 and 420 operate in like manner as the conventional data transmitter illustrated in FIG. 2, the data transmitter output data D0 and D1 of which waveforms shown in FIG. 7A are identical to the waveforms in FIG. 3.

FIG. 7B illustrates waveforms of data D0 and D1 output through the data transmitter during the low-power mode, i.e., when the LOW_POWER signal is activated. Herein, the first driver 410 is designed not to receive the off signal OFF, which is the same as the conventional first driver (see 210 of FIG. 2). In this case, the first driver 410 operates in the same manner as the normal mode, and the second driver 420 outputs the data D0 and D1 having the waveforms of FIG. 7B because the second driver 420 is turned off when the two data D0 and D1 differ from each other.

FIG. 7C illustrates waveforms of data D0 and D1 output through the data transmitter during the low-power mode, i.e., when the LOW_POWER signal is activated. Herein, the first driver 410 is designed to receive the off signal OFF as illustrated in FIG. 5. In this case, when the data D0 and the data D1 differ from each other, the first driver 410 drives the first and second output nodes TX_OUT and TX_OUTB inversely, and the second driver 420 is turned off. Consequently, the data transmitter outputs the data D0 and D1 having waveforms shown in FIG. 7C.

Although the data D0 and D1 have waveforms shown in FIG. 7B and 7C during the low-power mode, it is possible to discriminate logic levels of the data D0 and D1. Meanwhile, a section of maintaining 'Fully High' levels of the output nodes TX_OUT and TX_OUTB is greater in the low-power mode than the normal mode, compared to the waveform diagram of FIG. 7. This makes it possible to reduce unnecessary current consumption.

Figure 8:
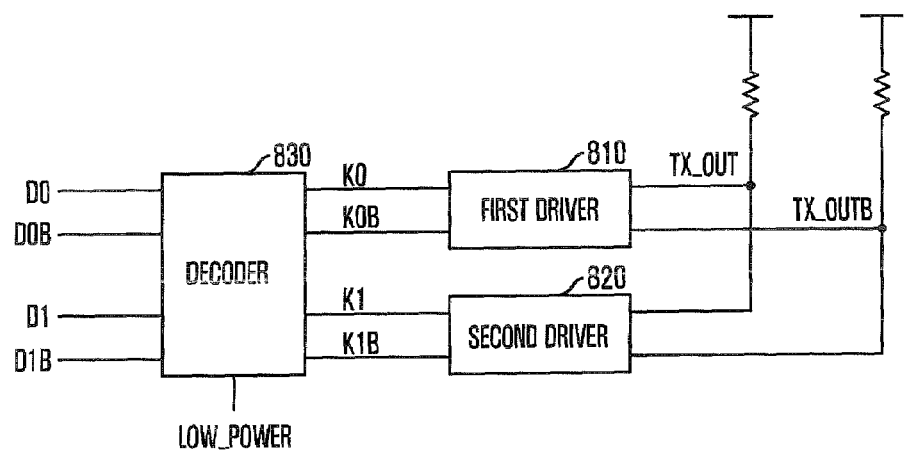
FIG. 8 is a block diagram of a data transmitter in accordance with another embodiment of the invention.

FIG. 8 is a block diagram of a data transmitter in accordance with another embodiment of the invention.

The data transmitter in accordance with this embodiment of FIG. 8 includes first and second output nodes TX_OUT and TX_OUTB terminated to a first level, a decoder 830, a first driver 810, and a second driver 820. The decoder 830 unchangingly outputs a first data pair of a first data D0 and an inverted first data D0B, and a second data pair of a second data D1 and an inverted second data D1B. However, in a low-power mode, i.e., when a LOW_POWER signal is activated, the decoder 830 outputs the first data D0 and the inverted first data D0B inversely, and outputs the deactivated second data pair D1 and D1B. The first driver 810 drives the first and second output nodes TX_OUT and TX_OUTB to a second level respectively in response to a first data K0 and an inverted first data K0B, which are output from the decoder 830. The second driver 820 drives the first and second output nodes TX_OUT and TX_OUTB to the second level respectively in response to a second data K1 and an inverted second data K1B, which are output from the decoder 830. Herein, the second driver 820 differs in driving force from the first driver 810.

The decoder 830 decodes the first data pair D0 and D0B and the second data pair D1 and D1B to output the first data K0, the inverted first data K0B, the second data K1 and the inverted second data K1B, which will be input to the first and second drivers 810 and 820. In the embodiment of FIG. 8, the data transmitter can output the data D0 and D1 having the waveforms of FIG. 7A during the normal mode and output the data D0 and D1 having the waveform of FIG. 7C during the low-power mode by differently inputting the data K0, K0B, K1 and K1B to the first and second drivers 810 and 820 depending on the normal mode (LOW-POWER signal is deactivated) or the low-power mode (LOW-POWER signal is activated). In short, the data transmitter of FIG. 8 further includes the decoder 830 at an input terminal of the conventional data transmitter of FIG. 2, and thus it can operate in like manner as the data transmitter of FIG. 4.

The decoder 830 outputs the first data D0, the inverted first data D0B, the second data D1 and the inverted second data D1B unchangingly during the normal mode and the low-power mode when the first data D0 and the second data D1 are equal to each other (that is, D0=K0, D0B=K0B, D1=K1 and D1B=K1B). However, when the first data D0 and second data D1 are not equal to each other during the low-power mode, the decoder 830 outputs the first data D0 and the inverted first data D0B inversely, and deactivates the second data pair D1 and D1B. The meaning the second data pair D1 and D1B is deactivated is that the second driver 820 cannot drive the first output node TX_OUT or the second output node TX_OUTB. Accordingly, both the second data K1 and the inverted second data K1B, output from the decoder 830, have logic levels of 1 ('High').

A truth table of the decoder 830 is summarized in the following.

TABLE 1

| LOW_POWER | D0, D1 | K0 | K0b | K1 | K1b |
|---|---|---|---|---|---|
| 0 | 0, 0 | 0 | 1 | 0 | 1 |
| 0 | 1, 0 | 1 | 0 | 0 | 1 |
| 0 | 0, 1 | 0 | 1 | 1 | 0 |
| 0 | 1, 1 | 1 | 0 | 1 | 0 |
| 1 | 0, 0 | 0 | 1 | 0 | 1 |
| 1 | 1, 0 | 0 | 1 | 1 | 1 |
| 1 | 0, 1 | 1 | 0 | 1 | 1 |
| 1 | 1, 1 | 1 | 0 | 1 | 0 |

Since the data K0, K0B, K1 and K1B are decoded by the decoder 830 and then input to the first and second drivers 810 and 820 differently according to the normal or low-power mode in this embodiment, the conventional first and second drivers (see 210 and 220 of FIG. 2) may be still applicable to the first and second drivers 810 and 820. Resultingly, the data transmitter outputs the data having the waveform of FIG. 7A during the normal mode, and outputs the data having the waveform of FIG. 7C during the low-power mode.

However, the second driver 820 may have a configuration different from that of the conventional second driver (220 of FIG. 2).

Figure 9:
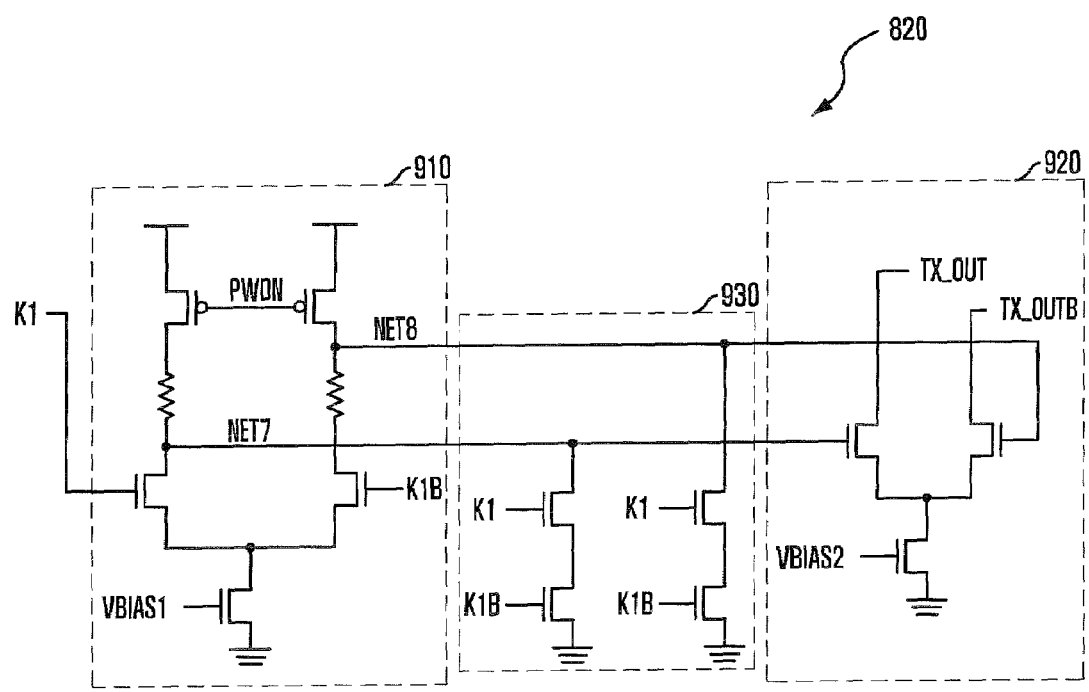
FIG. 9 is a circuit diagram of a second driver (820) in FIG. 8.

FIG. 9 is a circuit diagram of the second driver 820 in FIG. 8.

As similar to the conventional second driver (220 of FIG. 2), the second driver 820 includes a pre-driving unit 910 and a main driving unit 920. The second driver 820 may further include an off control unit 930.

The pre-driving unit 910 generates driving control signals NET7 and NET8 in response to the second data K1 and the inverted second data K1B, which are output from the decoder 830. The main driving unit 920 pulls down the first output node TX_OUT or the second output node TX_OUTB in response to the driving control signals NET7 and NET8.

The off control unit 930 deactivates both the driving control signals NET7 and NET8 in response to the second data K1 and the inverted second data K1B. When the second data K1 and the inverted second data K1B have logic values of (1, 1), the driving control signals NET7 and NET8 are deactivated to 'Low' level in any case but the off control unit 930 facilitates the driving control signals NET7 and NET8 to be deactivated to 'Low' level.

Operation of the second driver 820 is the same as the operation of the conventional second driver (220) except that the off control unit 930 is further provided to facilitate the driving control signals NET7 and NET8 to be deactivated when the second data K1 and the inverted second data K1B output from the decoder 830 have logic values of (1, 1). Hence, further description will be omitted herein.

Alternatively, the first driver 810 may further include the off control unit 930 to adjust loading of the driver.

Figure 10:
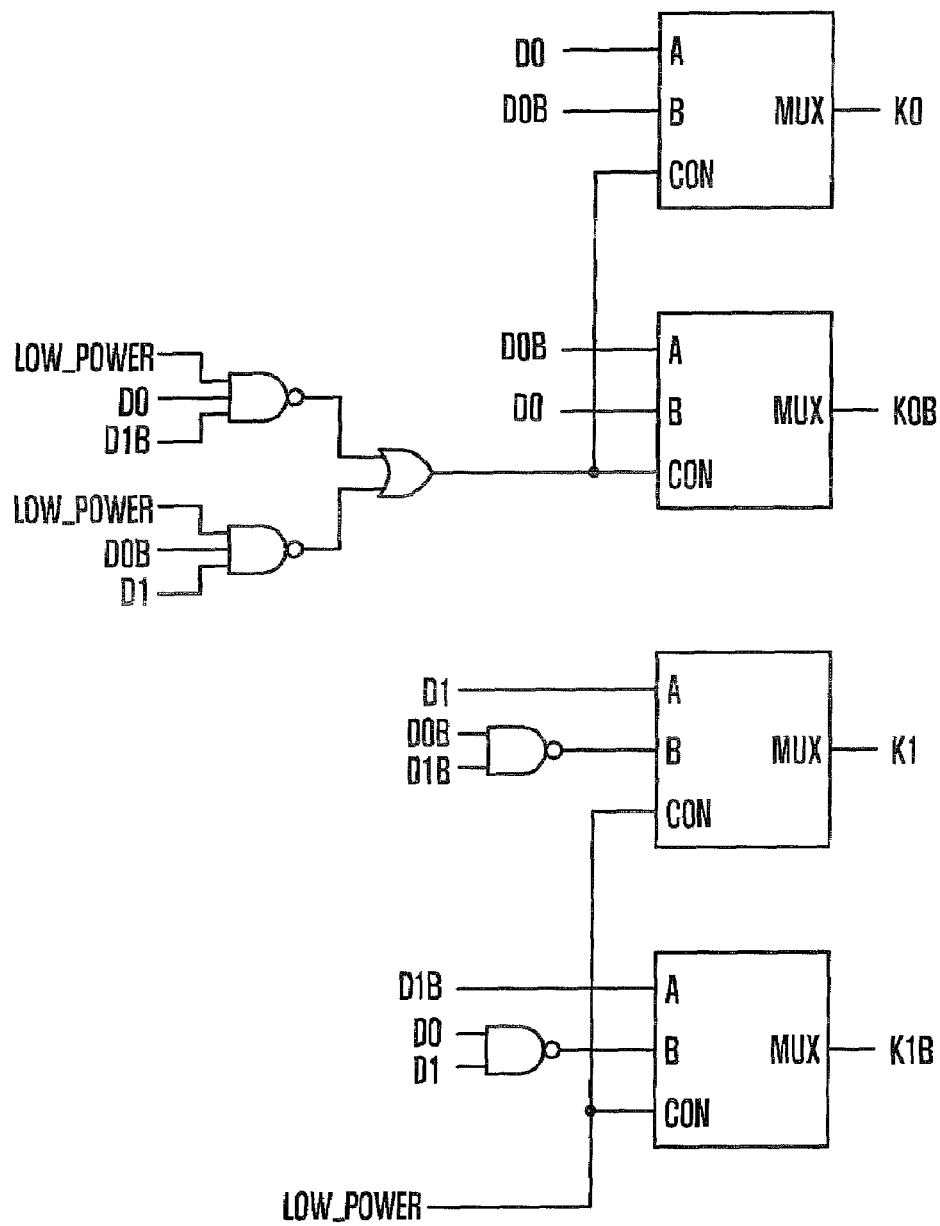
FIG. 10 is a circuit diagram of a decoder (830) in FIG. 8.

FIG. 10 is a circuit diagram of the decoder 830 in FIG. 8.

Specifically, FIG. 10 illustrates the decoder 830 configured to decode the data D0, D0B, D1 and D1B to output the data K0, K0B, K1 and K1B according to the truth table shown in Table 1. The operation of the decoder 830 can be fully appreciated from Table 1, and thus further description will be omitted herein.

The decoder 830 satisfying the truth table shown in Table 1 is not limited to the configuration shown in FIG. 10, but it may be modified into various configurations.

As described above, the data transmitter of the invention changes an outputting method depending on a normal mode or a low-power mode. Consequently, a semiconductor memory device having the data transmitter of the invention is advantageous in that it can be applied to a variety of data outputting modes using only one data transmitter.

While the invention has been described with respect to the specific embodiments, it will be apparent to those skilled in the art that various changes and modifications may be made without departing from the spirit and scope of the invention as defined in the following claims.

What is claimed is:

1. A data transmitter, comprising:
   first and second output nodes terminated to a first level;
   a controller configured to generate an off signal that is activated by logically combining first and second data during a low-power mode;
   a first driver configured to drive the first or second output node to a second level in response to the first data; and
   a second driver configured to drive the first or second output node to the second level with a driving force different from that of the first driver in response to the second data, the second driver being turned off when the off signal is activated.

2. The data transmitter as recited in claim 1, wherein the controller activates the off signal when the first and second data differ from each other in logic level during the low-power mode.

3. The data transmitter as recited in claim 2, wherein the first driver drives the first and second output nodes inversely when the off signal is activated.

4. The data transmitter as recited in claim 1, wherein the second level is a pull-down voltage level when the first level is a pull-up voltage level, and the second level is a pull-up voltage level when the first level is a pull-down voltage level.

5. The data transmitter as recited in claim 1, wherein the second driver includes:
   a pre-driving unit configured to generate driving control signals in response to the second data and inverted second data;
   an off control unit configured to deactivate the driving control signals when the off control signal is activated; and
   a main driving unit configured to drive the first or second output node in response to the driving control signals.

6. A data transmitter, comprising:
   first and second output nodes terminated to a first level;
   a decoder configured to unchangingly output a first data pair of a first data and an inverted first data and a second data pair of a second data and an inverted second data, except when the first and second data differ from each other during a low-power mode, and further configured to output the first data and inverted first data inversely and configured to output a deactivated second data pair, when the first and second data differ from each other during a low-power mode;
   a first driver configured to drive the first and second output nodes to a second level respectively in response to the first data and inverted first data of the first data pair output from the decoder; and
   a second driver configured to drive the first and second output nodes to the second level respectively in response to the second data and inverted second data of the second data pair output from the decoder, the first and second drivers having different driving forces.

7. The data transmitter as recited in claim 6, wherein the second level is a pull-down voltage level when the first level is a pull-up voltage level, and the second level is a pull-up voltage level when the first level is a pull-down voltage level.

8. The data transmitter as recited in claim 6, wherein the second driver includes a pre-driving unit configured to generate driving control signals in response to the second data pair, and a main driving unit configured to drive the first or second output node in response to the driving control signals.

9. The data transmitter as recited in claim 8, wherein the second driver further includes an off control unit configured to deactivate all the driving control signals in response to the second data pair output from the decoder.

* * * * *